United States Patent
Röhrlein

(10) Patent No.: US 7,561,708 B2
(45) Date of Patent: Jul. 14, 2009

(54) HEARING AID

(75) Inventor: Gerhard Röhrlein, Höchstadt (DE)

(73) Assignee: Siemens Audiologische Technik GmbH, Erlangen (DE)

( * ) Notice: Subject to any disclaimer, the term of this patent is extended or adjusted under 35 U.S.C. 154(b) by 868 days.

(21) Appl. No.: 11/104,682

(22) Filed: Apr. 13, 2005

(65) Prior Publication Data

US 2005/0238190 A1  Oct. 27, 2005

(30) Foreign Application Priority Data

Apr. 21, 2004 (DE) ........................ 10 2004 019 353

(51) Int. Cl.
*H04R 25/00* (2006.01)
(52) U.S. Cl. ........................ 381/315; 381/312; 381/314
(58) Field of Classification Search ................. 381/314, 381/315, 322, 331, 380, 328, 323, 312
See application file for complete search history.

(56) References Cited

U.S. PATENT DOCUMENTS

| 4,467,145 A | 8/1984 | Borstel |
| 4,679,240 A * | 7/1987 | Heide ........................ 381/321 |
| 5,553,152 A | 9/1996 | Newton |
| 5,659,621 A * | 8/1997 | Newton ...................... 381/312 |
| 6,330,339 B1 * | 12/2001 | Ishige et al. ................ 381/312 |
| 6,532,294 B1 * | 3/2003 | Rudell ........................ 381/315 |
| 6,920,229 B2 * | 7/2005 | Boesen ........................ 381/380 |
| 2002/0068537 A1 | 6/2002 | Shim et al. |
| 2004/0052391 A1 * | 3/2004 | Bren et al. .................. 381/331 |

FOREIGN PATENT DOCUMENTS

| DE | 31 09 049 A1 | 9/1982 |
| EP | 1 307 071 A1 | 5/2003 |
| WO | WO 98/54928 | 12/1998 |
| WO | WO 00/79769 A1 | 12/2000 |

* cited by examiner

*Primary Examiner*—Suhan Ni
*Assistant Examiner*—Jasmine Pritchard

(57) ABSTRACT

The increasing miniaturization of hearing aids means that less and less space is available for accommodating controls (9). It is thus proposed that, at least one proximity sensor (6; 12A, 12B) be provided on a hearing aid (1; 11) so as to enable an operating function to be performed even without touching a control directly. For operation of a hearing aid (1; 11) in accordance with the invention, in addition to the hearing aid (1; 11) itself, no further technical aids such as remote control, magnets etc. have to be worn as well.

13 Claims, 3 Drawing Sheets

HEARING AID

CROSS REFERENCE TO RELATED APPLICATIONS

This application claims priority to the German application No. 10 2004 019 353.3, filed Apr. 21, 2004 which is incorporated by reference herein in its entirety.

FIELD OF INVENTION

The invention relates to a hearing aid with at least one operating device.

BACKGROUND OF INVENTION

Progress in semiconductor component technology has made it possible to miniaturize hearing aids ever more. However the problem that arises when this is done is that, as the housings become smaller, there is less and less space for controls. Remote controls are thus frequently used to operate hearing aids. The disadvantage of these however is that they always have to be carried as well by hearing aid wearers.

A mobile telephone with a sensor (proximity sensor) is known from U.S. 2002/0068537 A1. This sensor measures the distance between the telephone and the user's head. With the sensor output signal the amplification of the loudspeaker or of the microphone can be controlled as a function of this distance.

A hearing aid is known from U.S. Pat. No. 5,341,433 in which a pressure or position sensor designed as a film is present as a control element. The sensor is accommodated on the outside of the housing and reacts to even a light touch. The sensor switch has the disadvantage of requiring a comparatively large amount of space on the outside the housing and having to be touched directly to initiate a switching function.

A hearing device is known from DE 31 09 049 A1 featuring switches to execute operating functions. Furthermore magnetic switches are provided with the known hearing device which feature elements which can be influenced in their electric conductance by magnetic fields, e.g. reed contacts or magnetic field semiconductors. Thus a switching function can be initiated manually by moving a magnet. The magnetically-activatable switches can however also be used, on introduction of a magnetic field present outside the device, such as that of a telephone receiver, to switch on automatically an additional unit in the device such as a unit to improve the reception of a telephone call (induction coil).

SUMMARY OF INVENTION

A disadvantage of the known hearing device is that, like using a remote control, additional means (magnets) also have to be present here to initiate the switching function.

An object of the invention is thus to improve the direct manual operation of a hearing aid device.

This object is achieved by the claims.

The advantage of the invention is that a control on the hearing aid does not have to be touched directly to initiate an operating function. Furthermore it is also not necessary to carry a remote control or further technical aids (magnets). A switching function is initiated as soon as the hearing aid wearer brings one or more fingers of their hand, into the vicinity of the hearing aid. The proximity sensor present in the hearing aid detects this movement and then executes the switching function associated with the proximity sensor. In this case both the entry of the hand into the detection area of the proximity sensor and also its exit from this area can initiate the switching function.

To avoid switching malfunctions provision is made in one embodiment of the invention for a specific chronological sequence of the hand movements into and out of the detection area to be adhered to in order to initiate the switching function. E.g. a switching function is only triggered if the hand moves out of the detection area again within 2 to 3 seconds of its entry into the area.

A further embodiment of the invention makes provision for a specific chronological sequence of a multiple movement into and/or out of the area to have to occur so that the relevant operating function is initiated. For example a switching function is only initiated if the hearing aid wearers hand moves into and out of the detection area three times within 5 seconds. This largely avoids any unintentional switching.

The times given above can preferably be set by programming the hearing aid. In particular this allows adaptation to the requirements of the hearing aid wearer as regards the times and switching pattern set.

The operating function executed by the proximity sensor preferably relates to the setting of the active hearing program or to volume control. For example if a switching function is correctly executed in this way the program number (e.g. hearing program 3) can be incremented by one until the hearing program with the highest program number is set. A further switching function then leads to the setting of the hearing program with the lowest program number (hearing program 1).

Another variant of the invention makes provision for different operating functions to be initiated at one and the same hearing aid by different chronological sequences of moving the hand into or out of the detection area of the proximity sensor. E.g. for a double movement of hand within a specific period the program number can be decremented by one and with a triple hand movement the program number can be incremental by one compared to the hearing program originally set.

For volume control especially it is advantageous for not just the movement of the hand into and out of the detection area to be registered but also the distance and particularly a change in the distance of the hand from the proximity sensor during the switchover process. Then through a specific switching pattern, i.e. a specific chronological sequence of the movements of the hand, not only is a switching function executed but the hearing aid is initially transferred into a state in which changes in the distance of the hearing aid wearer's hand from the proximity sensor are detected. Thus for example an increase in the distance can bring about an increase in the volume set. Conversely the volume will be reduced if the hand is moved closer to the hearing aid. Similarly the program switchover, starting from a specific hearing program, to a higher or lower hearing program can be performed by a corresponding evaluation of the change in distance.

With a switching function executed in accordance with the invention the hearing aid wearer can advantageously receive a perceivable signal to confirm a correctly executed operation of the hearing aid in conjunction with the proximity sensor. For example beep tones will be generated after a program switchover and directed to the hearing of the hearing aid wearer, with the number of beeps allowing the program number of the hearing program now active to be detected. With the multi-step operation described above in particular in which the hearing aid to be operated in a first step is initially put into a state, starting from which in a second step a change of the distance to the initiating hand is registered, advantageously the first step already recognized by the hearing aid can be indicated by an acoustic signal (e.g. one short beep), even if no change of a parameter relating to the signal processing in a hearing aid is yet associated with this.

To prevent unintended switching functions the detection area of the proximity sensor used is kept relatively narrow. Preferably a switching function is only initiated if the hand is at a distance of a few centimeters from the proximity sensor. Only in exceptional conditions will a switching function be executed if the hand is further away than 10 cm. With a preferred embodiment of the invention the detection area of the proximity sensor can be set when the hearing aid is programmed and thereby adapted to the needs of the hearing aid wearer.

One embodiment of the invention makes provision for different switching functions to be executed depending on the distance at which the hand is moved in front of the proximity sensor. For example when a hand is moved in front of the proximity sensor very close to the ear a first switching function is initiated and when it is moved relatively far away from the ear (e.g. more than 10 cm) a second switching function different from the first switching function is initiated.

A further embodiment of the invention makes provision for the use of a number of proximity sensors for a hearing aid, which differ as regards their detection area relative to the hearing aid. Thus a first proximity sensor can react to a hand moved very close to the hearing aid (e.g. at a distance of less than 3 cm) and initiate a switching function whereas a second proximity sensor reacts to a hand moved at a greater distance (e.g. greater than 8 cm) and triggers a second switching function. The detection area of the proximity sensor with regard to be hearing aid can differ not only in respect of the distance but also as regards the alignment. Thus the first detection area can be aligned in the line of sight and a second detection area in an opposite direction.

A number of proximity sensors can thus be used to avoid incorrect switching. Thus for example with a hearing aid with two proximity sensors a switching function is only initiated when the hand is first detected by the first proximity sensor and then detected by the second proximity sensor, subsequently only detected again by the first proximity sensor and finally no longer detected by either of the two proximity sensors, with the entire process having to occur within a short time (e.g. 2 sec). The direction from which the hand must be brought up to the hearing aid and the direction in which it must be taken away again to initiate a specific switching function can thus be generally established in a simple way. This largely excludes any unintentional initiation of a switching function.

With CIC hearing aids the distance between the hand and the proximity sensor is preferably set so that a switching function is only triggered if the distance is very small. For example a switching function is only initiated if a finger is placed directly in the concha of the relevant ear and thereby to a certain extent covers the entrance to the auditory channel. This largely avoids any unintentional switchover.

The proximity sensor used in conjunction with the invention is not restricted to a specific functional principle. All widely available proximity sensors which allow an appropriate miniaturization can be used in conjunction with the invention, for example. infrared proximity sensors, ultrasound proximity sensors, inductive proximity sensors or capacitive proximity sensors.

The invention is not restricted to a specific switching function. Instead any switching function that can be executed for a hearing aid can in principle also be undertaken in conjunction with the proximity sensor in accordance with the invention. Further it is possible, by programming the hearing aid, to define the switching functions to be executed in conjunction with the hearing aid. It is also possible that for a binaural supply for the hearing aid which is worn in or on the left ear a switching function is initiated which is other than the function initiated for the hearing aid worn on the right ear. Preferably the switching function executed in each case, through coupling of the two hearing aids, then operates on both hearing aids.

BRIEF DESCRIPTION OF THE DRAWINGS

The invention is explained in more detail below on the basis of an exemplary embodiment. The Figures show.

DETAILED DESCRIPTION OF INVENTION

Figure 1:
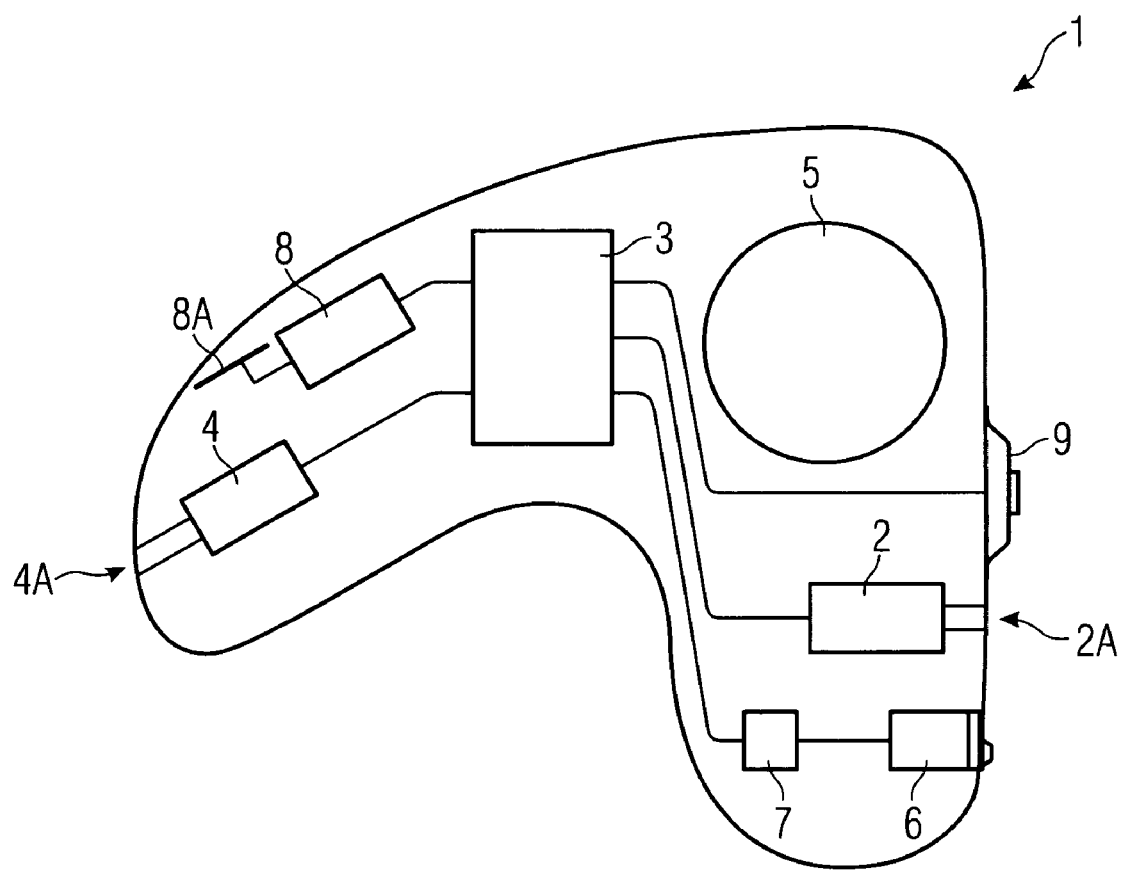
FIG. 1 a block diagram of a in-ear hearing aid with proximity switch.

FIG. 1 shows an in-ear hearing aid 1 with its main components. These are a microphone 2 with a sound entry opening 2A to accept an acoustic signal and convert it into an electrical signal. The electrical signal is fed to a signal processing unit 3 for further processing and frequency-dependent amplification. Finally the signal which can be further processed and amplified is converted back by means of an earpiece 4 from an electrical signal into an acoustic signal and output via the sound channel 4A into the auditory canal of a hearing aid wearer. A battery 5 is used to supply power to the electrical components of the hearing aid 1.

The transmission characteristics of the hearing aid 1 in accordance with the exemplary embodiment can be adapted to different hearing situations (e.g. "quiet environment", "conversation", "conversation in a noisy environment "traveling in a car" etc.). The selection is made by setting specific sets of parameters (hearing programs), which match the signal processing to the relevant hearing situation. The switch between the hearing programs is made by operation of the hearing aid 1. With the hearing aid 1 in accordance with the invention the operation to switch programs is undertaken by means of a proximity sensor 6. This registers the entry and exit of an object from its detection area. To avoid an unintentional switchover, the proximity sensor 6 is assigned an evaluation unit 7. In this unit specific switching patterns which have to be adhered to execute a specific switching function can be defined by programming the hearing aid 1. The hearing aid 1 in accordance with the invention can for example be set so that the initiating object, preferably the hand of the hearing aid wearer, has to enter and leave the detection area of the proximity sensor 6 three times in a period of around 3 seconds. If this type of switching pattern is recognized, a program switchover can be undertaken in a short time for the hearing aid. To do this the hand must again be moved into the detection area of the proximity sensor 6, with the distance of the hand from the proximity sensor 6 now being determined. A reduction of the distance then causes a switchover to a hearing program with a lower program number, e.g. from hearing program 4 to hearing program 3. If on the other hand the distance is increased, this leads to a switchover into a hearing program with of a higher program number, e.g. from hearing program 4 to hearing program 5.

The hearing aid 1 in accordance with the exemplary embodiment includes as a further component a transmitter and receiver unit 8 with an antenna 8A for wireless data exchange with a further hearing aid for binaural supply to a hearing aid wearer. In the exemplary embodiment this also transmits to the second hearing aid a program switchover instigated in the way described, which thereby performs the same program switchover. In the opposite direction, for a second hearing aid of the same design, the volume control setting can be changed in a similar way by means a proximity sensor corresponding to the proximity sensor 6, said change then being transmitted over the antenna 8A and the transceiver unit to hearing aid 1 and effecting a similar change in volume there.

A touch switch 9 is also present as a further component for hearing aid 1 in accordance with the exemplary embodiment, through which a switching function can also be initiated by direct contact. For example this switching function can involve switching the noise cancellation algorithm on or off. Activation of the touch switch 9 makes operation by means of the proximity sensor 6 not possible for a short time. This ensures that for activation of the touch switch 9, which is necessarily associated with bringing the hand into the detection area of the proximity sensor 6, unintentional switching processes by the proximity sensor 6 are suppressed.

The use of the proximity sensor 6 allows a switching function to be executed for the hearing aid 1 in accordance with the exemplary embodiment without direct contact with an operating element. No technical aids (remote control, magnets etc.) are necessary which would have to be carried with the hearing aid. The invention is thus especially advantageous for hearing aids that can be worn in the ear and especially auditory canal devices, since with such devices there is hardly any space to accommodate conventional controls and furthermore the normal controls can only be accessed with difficulty. However the invention is not restricted to a hearing aid which can be worn in-ear but can be used in principle for all known hearing aid designs.

Figure 2:
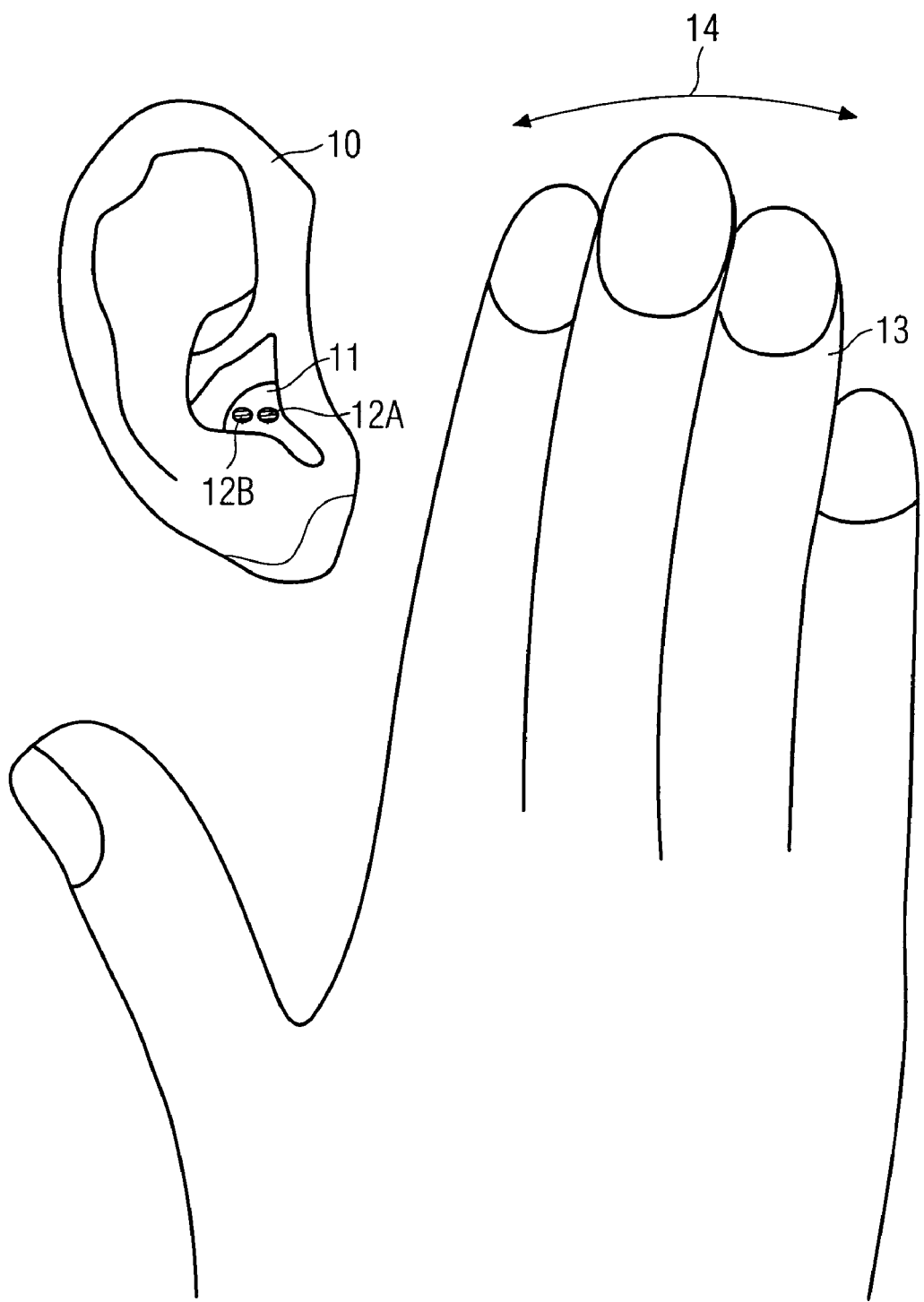
FIG. 2 an ear with an in-ear hearing aid viewed from the side of the head.

FIGS. 2 and 3 are again designed to illustrate the initiation of a switching process for a hearing aid in accordance with the invention. To this end FIG. 2 shows an auricle 10 in a side view of the head. In the auricle 10 there is an in-ear hearing aid 11 most of which extends into the auditory canal (not shown). The hearing aid 11 in accordance with the exemplary embodiment comprises two proximity sensors 12A and 12B arranged at a distance from one another. If the hand 13 of the hearing aid wearer is now moved in a specific predefined rhythm close to the hearing aid 11 and then removed again, as indicated by the double arrow 14, this initiates a control function.

To avoid incorrect switching, a switching function is only initiated however for the hearing aid 11 when the hand is initially detected by proximity sensor 12A, is then detected by the two proximity sensors 12A and 12B, is then only detected by the proximity sensor 12A and is subsequently no longer detected by either of the two proximity sensors. Thus, in the exemplary embodiment, a switching function is only initiated if the hand is moved from the front (from the direction of the front of the head) past the ear and is removed again in a forward direction. Furthermore the switching function concerned is only initiated if the initiating movement pattern is executed within a short time, e.g. within 2 seconds.

Naturally other movement patterns which have to be executed to initiate a switching function can be also specified by means of the two proximity sensors 12A and 12B and by the associated control. For example with another programming of the hearing aid 11 a switching function is only initiated if the hand 13 is first moved backwards past the ear (until it is again outside the detection areas of the two proximity sensors 12A, 12B) and is subsequently moved forwards past the ear.

To execute different switching functions (increase program number, reduce program number, increase volume, reduce volume, switch on filter etc.) different movement patterns can be specified which must be adhered to execute the relevant switching function.

Furthermore the detection areas of the two proximity sensors can also be aligned differently, so that the detection area of proximity sensor 12A is aligned sideways to the front while the detection area of proximity sensor 12B is aligned sideways to the rear. Then a hand moved backwards past the ear can initiate a different function from a hand moved forwards past the ear.

Figure 3:
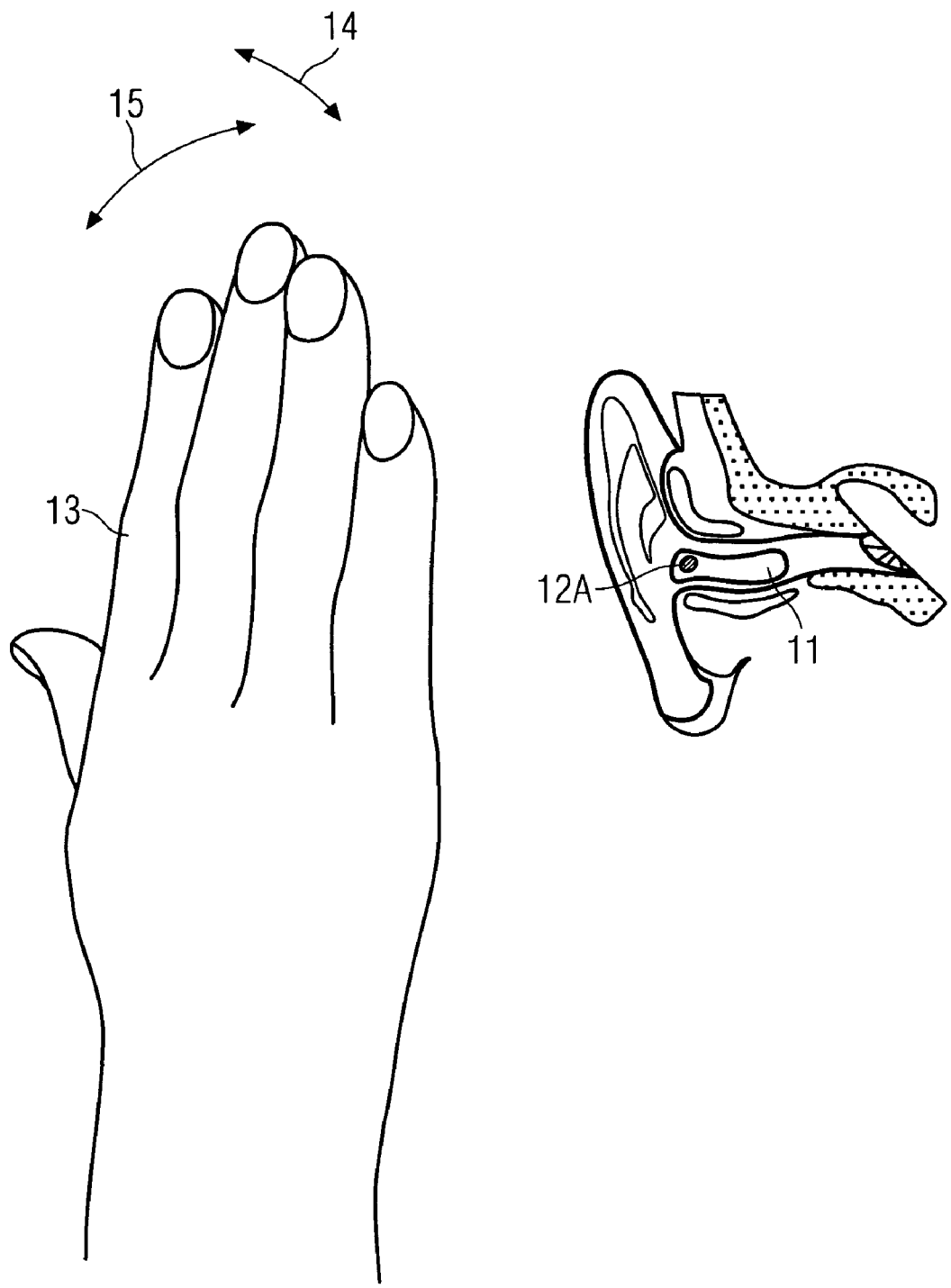
FIG. 3 a longitudinal section through the outer auditory canal, in which an in-ear hearing aid in accordance with the invention is located.

FIG. 3 shows a longitudinal section of the outer auditory canal and the hearing aid 11 located within it. FIG. 3 illustrates that as well as moving the hand 13 in the direction of the double arrow 14 it is also possible to move it in the direction of the double arrow 15, that is towards the ear and then away from it. As described in the exemplary embodiment in accordance with FIG. 1, the hearing aid 11 with the proximity sensors 12A and 12B (hidden) can in this way first be put into a mode in which the distance between the hand 13 and the proximity sensors and especially a change in this distance is evaluated. This also enables complex switching functions, as described in the embodiment for FIG. 1 (e.g. volume control) to be performed.

The invention also offers the option of executing different switching functions depending on the distance at which the hand 13 is moved past the proximity sensors 12A and 12B. For example when the hand 13 is moved very close to the ear past the proximity sensors a program change is undertaken and if the distance from the ear is relatively large (e.g. more than 10 cm) when the hand 13 is moved past the proximity sensors 12A and 12B an algorithm for feedback suppression is activated or deactivated.

The invention claimed is:

1. A hearing aid, comprising:
    an operating device for operating the hearing aid where the operating device comprises
        a microphone with a sound entry opening configured to accept an acoustic signal and convert into an electrical signal,
        a signal processing unit that accepts the converted electrical signal and further processes and frequency dependently amplifies the signal,
        an earpiece that converts the processed electrical signal into an acoustic output signal, and
        a power supply that provides electrical power to the hearing aid device; and
    a proximity sensor having a detection area and included in the operating device for triggering an operating function of the hearing aid, wherein the proximity sensor is configured to trigger the operating function if a hand of a user of the hearing aid is moved into or out of the detection area without the use of a remote control device or additional technical aids.

2. The hearing aid in accordance with claim 1, wherein the operating function is triggered by a specific chronological sequence of multiple entries or exits of the hand into respectively out of the detection area.

3. The hearing aid in accordance with claim 1, wherein a plurality of different operating functions are triggered by a plurality of different chronological sequences of multiple entries or exits of the hand into respectively out of the detection area.

4. The hearing aid in accordance with claim 1, wherein the operating function includes adjusting an active hearing program.

5. The hearing aid in accordance with claim 4, wherein adjusting the active hearing program includes controlling a volume of the active hearing program.

6. The hearing aid in accordance with claim 1, wherein triggering the operating function is based upon a distance of the hand from the proximity sensor.

7. The hearing aid in accordance with claim 1, wherein triggering the operating function is based upon a change of distance of the hand from the proximity sensor.

8. The hearing aid in accordance with claim 1, in which the detection area is limited by a distance from the proximity sensor, the distance taken from the range between 0 cm to 10 cm.

9. The hearing aid in accordance with claim 1, wherein the proximity sensor is an element taken from the group consisting of an infrared proximity sensor, an ultrasound proximity sensor, an inductive proximity sensor and a capacitive proximity sensor.

10. The hearing aid in accordance with claim 1, further including a control element for disabling the triggered operating function if the control element is touched by the hand after the move into respectively out of the detection area.

11. The hearing aid in accordance with claim 1, wherein a plurality of proximity sensors are provided having different detection areas relative to the hearing aid.

12. The hearing aid in accordance with claim 1, wherein the hearing aid is sized and configured as an in-ear-hearing aid.

13. The hearing aid in accordance with claim 12, wherein the hearing aid is sized and configured to be arranged in its entirety within an auditory canal of the user of the hearing aid.

* * * * *